United States Patent
Takata et al.

(10) Patent No.: US 11,817,910 B2
(45) Date of Patent: Nov. 14, 2023

(54) LIGHT-RECEIVING DEVICE

(71) Applicant: NEC Corporation, Tokyo (JP)

(72) Inventors: Koya Takata, Tokyo (JP); Hiroki Sugiyama, Tokyo (JP); Fujio Okumura, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 161 days.

(21) Appl. No.: 17/617,351

(22) PCT Filed: Jun. 8, 2020

(86) PCT No.: PCT/JP2020/022541
§ 371 (c)(1),
(2) Date: Dec. 8, 2021

(87) PCT Pub. No.: WO2020/250850
PCT Pub. Date: Dec. 17, 2020

(65) Prior Publication Data
US 2022/0360341 A1    Nov. 10, 2022

(30) Foreign Application Priority Data

Jun. 13, 2019 (JP) .................................. 2019-110496

(51) Int. Cl.
*H04B 10/67* (2013.01)
*H04B 10/114* (2013.01)
*G02B 6/42* (2006.01)

(52) U.S. Cl.
CPC ......... *H04B 10/671* (2013.01); *G02B 6/4206* (2013.01); *H04B 10/1141* (2013.01)

(58) Field of Classification Search
None
See application file for complete search history.

(56) References Cited

U.S. PATENT DOCUMENTS 6,330,092 B1 * 12/2001 Aronson .............. H04B 10/532
                                                          398/119
6,552,317 B1    4/2003 Takeda et al.
(Continued)

FOREIGN PATENT DOCUMENTS

JP    H06-068379 A    3/1994
JP    H11-202263 A    7/1999
(Continued)

OTHER PUBLICATIONS

Japanese Office Communication for JP Application No. 2021-526077 dated Aug. 9, 2022 with English Translation.
(Continued)

*Primary Examiner* — Jai M Lee
(74) *Attorney, Agent, or Firm* — Sughrue Mion, PLLC

(57) ABSTRACT

A light-receiving device includes: a light guide plate that is a transparent member having, as main surfaces, a first surface and a second surface facing each other and has an emission end formed on at least one end portion of the light guide plate; a wave plate that is disposed on the first surface of the light guide plate and converts an optical signal of circularly polarized light into linearly polarized light; a hologram layer that is disposed on the second surface of the light guide plate and guides a traveling direction of the optical signal converted into the linearly polarized light toward the emission end of the light guide plate; and a light receiver that receives the optical signal emitted from the emission end of the light guide plate and converts the received optical signal into an electrical signal.

10 Claims, 18 Drawing Sheets

(56) References Cited

U.S. PATENT DOCUMENTS

| | | | |
|---|---|---|---|
| 8,174,952 B2* | 5/2012 | Kitabayashi | G11B 7/131 |
| | | | 369/94 |
| 9,048,959 B2* | 6/2015 | Voutilainen | H04B 10/801 |
| 9,705,631 B2* | 7/2017 | Hashimoto | H04B 10/1123 |
| 11,256,086 B2* | 2/2022 | Amirsolaimani | G02B 6/27 |
| 2010/0092047 A1* | 4/2010 | Yamamoto | G02B 6/0055 |
| | | | 340/5.82 |
| 2017/0205618 A1* | 7/2017 | Basset | G02B 6/00 |

FOREIGN PATENT DOCUMENTS

| | | |
|---|---|---|
| JP | 2001-060337 A | 3/2001 |
| JP | 2003-346355 A | 12/2003 |
| JP | 2011-100526 A | 5/2011 |
| JP | 2018-026095 A | 2/2018 |
| WO | 2008/123584 A1 | 10/2008 |

OTHER PUBLICATIONS

International Search Report for PCT Application No. PCT/JP2020/022541, dated Aug. 11, 2020.

English translation of Written opinion for PCT Application No. PCT/JP2020/022541, dated Aug. 11, 2020.

\* cited by examiner

LIGHT-RECEIVING DEVICE

This application is a National Stage Entry of PCT/JP2020/022541 filed on Jun. 8, 2020, which claims priority from Japanese Patent Application 2019-110496 filed on Jun. 13, 2019, the contents of all of which are incorporated herein by reference, in their entirety.

TECHNICAL FIELD

The present invention relates to a light-receiving device that receives an optical signal. In particular, the present invention relates to a light-receiving device that receives an optical signal used for optical space communication.

BACKGROUND ART

In vehicle-to-vehicle communication or road-to-vehicle communication, if optical space communication in which an optical signal propagating through space is transmitted and received is used, secure communication can be performed with a large capacity without being disturbed by radio waves.

PTL 1 discloses an optical transmission/reception device including a light-emitting unit that transmits an optical signal to other vehicle, a light-receiving unit that receives an optical signal from other vehicle, and an omnidirectional optical component. The device of PTL 1 is attached to, for example, an upper part of an automobile, and can receive, by the light-receiving unit, optical signals from all directions in a substantially horizontal direction, which are transmitted from the another vehicle, to perform omnidirectional reception.

PTL 2 discloses a vehicle decoder including a hologram layer that diffracts an optical signal incident from the outside in a predetermined direction, a light guide plate that transmits the diffracted optical signal, a light-receiving element that receives the transmitted optical signal, and a decoder that decodes the received optical signal. The device of PTL 2 is provided, for example, in the vicinity of a rear window or a front window, and can be used for optical space communication between vehicles or between a road and a vehicle.

CITATION LIST

Patent Literature

[PTL 1] JP 2018-026095 A
[PTL 2] JP 06-068379 A

SUMMARY OF INVENTION

Technical Problem

In a case where a shielding object such as mud or snow adheres to a light-receiving surface, the device of PTL 1 cannot communicate with a direction in which the shielding object adheres. In addition, since the device of PTL 1 has a special shape, it is difficult to take measures such as attaching a wiper. That is, the device of PTL 1 has a problem that it is difficult to continue the communication in the case where the shielding object adheres to a transceiver.

In the device of PTL 2, since the optical signal is received by the single light-receiving element, a light-receiving surface on which the optical signal is incident from the outside can be one-dimensionally extended, but cannot be two-dimensionally expanded. If the light-receiving surface can be two-dimensionally expanded, the communication can be continued even if the shielding object adheres to a part of the light-receiving surface, but a plurality of light-receiving elements is required.

An object of the present invention is to solve the above-described problems and to provide a light-receiving device capable of performing continuous optical space communication even if a part of a light-receiving surface is shielded.

Solution to Problem

A light-receiving device of one aspect of the present invention includes: a light guide plate that is a transparent member having, as main surfaces, a first surface and a second surface facing each other and has an emission end formed on at least one end portion of the light guide plate; a wave plate that is disposed on the first surface of the light guide plate and converts an optical signal of circularly polarized light into linearly polarized light; a hologram layer that is disposed on the second surface of the light guide plate and guides a traveling direction of the optical signal converted into the linearly polarized light toward the emission end of the light guide plate; and a light receiver that receives the optical signal emitted from the emission end of the light guide plate and converts the received optical signal into an electrical signal.

Advantageous Effects of Invention

According to the present invention, it is possible to provide a light-receiving device capable of performing continuous optical space communication even if a part of a light-receiving surface is shielded.

EXAMPLE EMBODIMENT

Figure 1:
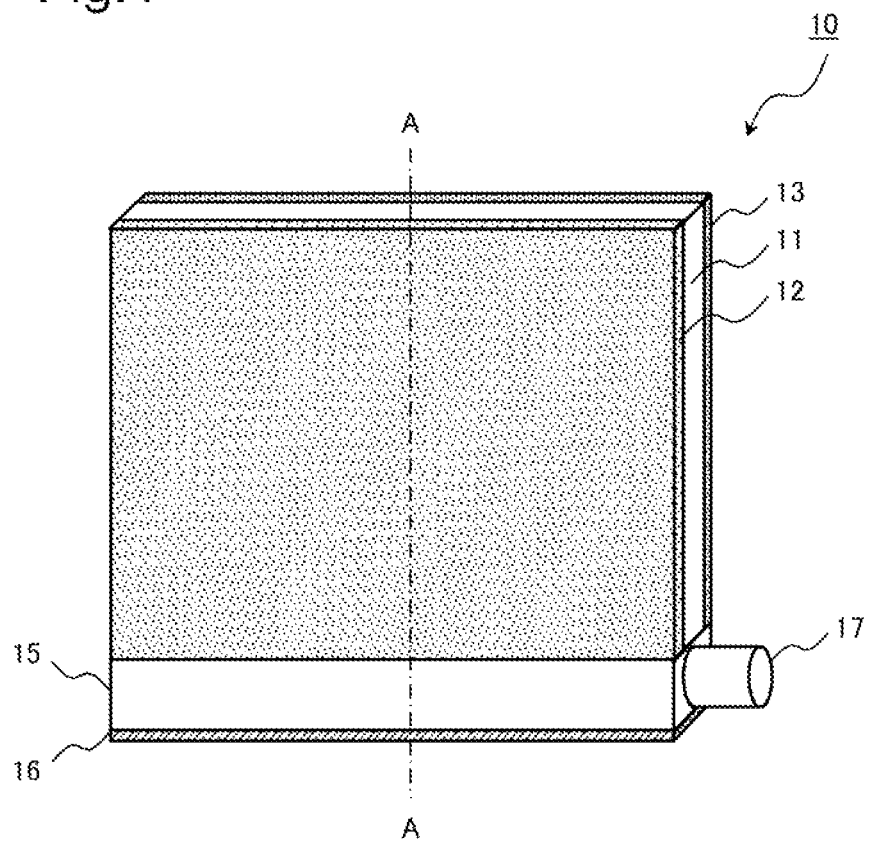
FIG. 1 is a perspective view of an example of a light-receiving device according to a first example embodiment of the present invention.

Hereinafter, example embodiments of the present invention will be described with reference to the drawings. However, although the example embodiments described below have technically preferable limitations for carrying out the present invention, the scope of the invention is not limited to the following. In all the drawings used for describing the following example embodiments, the same reference signs are given to similar components unless there is a particular reason. In the following example embodiments, repeated description of similar components and operations may be omitted. In all the drawings used for describing the following example embodiments, the sizes and shapes of components, the connection relationship, positional relationship, and the like between the components are examples, and are not limited to these forms as they are.

In addition, a direction of an arrow in the drawings is an example and does not limit a direction in which light or a signal travels. A line indicating the traveling of light in the drawings is conceptual, and does not accurately indicate an actual traveling direction or state of light. For example, in the following drawings, a change in the traveling direction or state of light due to refraction, reflection, diffusion, or the like at an interface between air and a substance may be omitted, or a light flux may be expressed by one line.

First Example Embodiment

First, a light-receiving device according to a first example embodiment of the present invention will be described with reference to the drawings. A wavelength band of an optical signal received by the light-receiving device of the present example embodiment is in an infrared region. The light-receiving device of the present example embodiment changes a traveling direction of an incident optical signal toward a light receiver using a hologram element as a kind of diffraction grating.

In a case where signal light of linearly polarized light is guided by the hologram element, a direction in which the signal light is guided is affected by a polarization direction of the signal light. For example, when signal light of linearly polarized light having a polarization direction orthogonal to a polarization direction (hereinafter, this polarization direction is also referred to as a predetermined direction) of linearly polarized light guided by the hologram element toward the light receiver is incident on the hologram element, the signal light is not guided toward the light receiver, and thus, most of the optical signal is not received by the light receiver.

In order to avoid such a situation, in a light-transmitting device (not illustrated), an optical signal of linearly polarized light having one polarization direction is converted into circularly polarized light and then transmitted toward the light-receiving device of the present example embodiment. When receiving the optical signal of the circularly polarized light transmitted from the light-transmitting device, the light-receiving device of the present example embodiment converts a polarization direction of the signal light of the circularly polarized light into the linearly polarized light in the predetermined direction, and then causes the linearly polarized light to be incident on the hologram element. When the optical signal of the linearly polarized light whose polarization direction is the predetermined direction is incident on the hologram element, the optical signal is guided toward the light receiver. As described above, the linearly polarized light having one polarization direction is converted into the circularly polarized light and the circularly polarized light is transmitted and received, so that the light-receiving device guides the linearly polarized light whose polarization direction is the predetermined direction toward the light receiver, and the light receiver can receive the linearly polarized light.

(Configuration)

Figure 2:
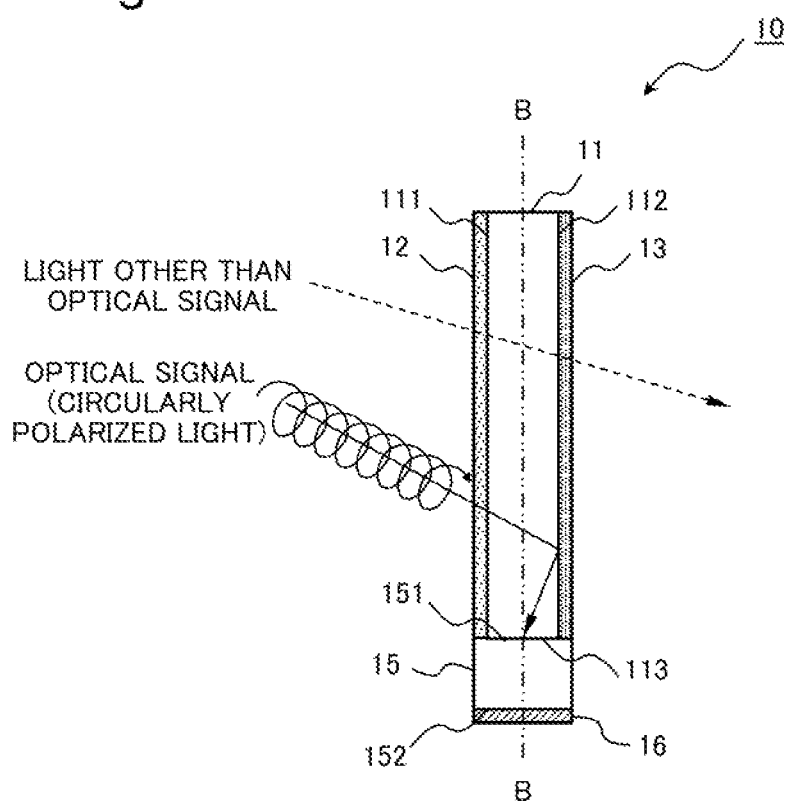
FIG. 2 is a cross-sectional view of the example of the light-receiving device according to the first example embodiment of the present invention.
Figure 3:
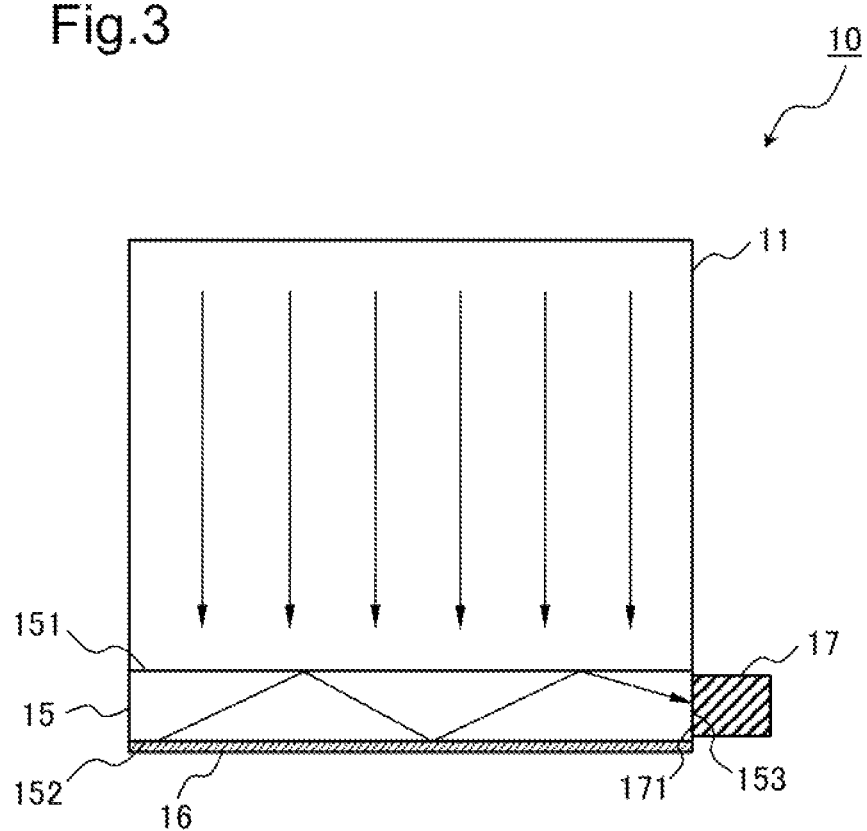
FIG. 3 is another cross-sectional view of the example of the light-receiving device according to the first example embodiment of the present invention.

FIGS. 1 to 3 are conceptual diagrams for describing an example of a configuration of a light-receiving device 10 of the present example embodiment. FIG. 1 is a perspective view of the example of the light-receiving device 10. FIG. 2 is a cross-sectional view of the light-receiving device 10 taken along a line A-A in FIG. 1. FIG. 3 is a cross-sectional view of the light-receiving device 10 taken along a line B-B in FIG. 2. FIGS. 2 and 3 illustrate arrows conceptually illustrating a state of light traveling.

The light-receiving device 10 includes a light guide plate 11, a wave plate 12, a hologram layer 13, a relay light guide plate 15, a directional light guide layer 16, and a light receiver 17.

The light guide plate 11 is a plate-shaped transparent member having, as main surfaces, a first surface 111 and a second surface 112 facing each other. The transparent member is a member having small attenuation of light in a wavelength region including a wavelength of the optical signal. The light guide plate 11 is preferably made of a material having small attenuation of light in a wavelength region including a visible region and an infrared region. An emission end 113 is formed on one end surface of the light guide plate 11. The light guide plate 11 has a plate-like outer shape, and the emission end 113 is formed on one end surface of the light guide plate 11. The first surface 111 is a light-receiving surface that receives the optical signal having passed through the wave plate 12. The emission end 113 is an end portion from which the optical signal having propagated inside the light guide plate 11 is emitted. Note that, in FIG. 1, the light guide plate 11 is illustrated to have a flat plate shape, but the light guide plate 11 may be formed in a curved surface shape or may include a curved surface portion.

The wave plate 12 is disposed on the first surface 111 of the light guide plate 11. The hologram layer 13 is disposed on the second surface 112 of the light guide plate 11. That is, the light guide plate 11 is sandwiched between the wave plate 12 and the hologram layer 13. The relay light guide plate 15 is disposed at the emission end 113 of the light guide plate 11.

The light guide plate 11 is formed of a material that transmits light such as the optical signal. For example, the light guide plate 11 can be made of a material such as glass or plastic.

The traveling direction of the optical signal (linearly polarized light) having passed through the wave plate 12 and incident on the inside of the light guide plate 11 from the first surface 111 is changed toward the emission end 113 by the hologram layer 13 disposed on the second surface 112. The optical signal whose traveling direction has been changed by the hologram layer 13 propagates inside the light guide plate 11 toward the emission end 113. In FIG. 3, a state in which the received optical signal propagates inside the light guide plate 11 toward the relay light guide plate 15 is indicated by arrows.

The wave plate 12 is disposed on the first surface of the light guide plate 11. The wave plate 12 is a quarter wave plate that gives a phase difference of $\lambda/4$ ($\pi/2$) to a polarization plane of the optical signal propagating through space and converts the optical signal from the circularly polarized light into the linearly polarized light in the predetermined direction ($\lambda$: the wavelength of the optical signal). The optical signal converted into the linearly polarized light in the predetermined direction by the wave plate 12 enters the first surface 111 of the light guide plate 11.

The hologram layer 13 is disposed on the second surface 112 of the light guide plate 11. The hologram layer 13 changes the traveling direction of the optical signal (linearly polarized light in the predetermined direction). The predetermined direction is a polarization direction after the optical signal of the circularly polarized light passes through the wave plate 12 and becomes the linearly polarized light. The hologram layer 13 is designed according to the polarization direction (polarization direction in the predetermined direction) of the optical signal having passed through the wave plate 12 and converted into the linearly polarized light. The hologram layer 13 guides the optical signal whose polarization direction is the predetermined direction, which has been incident on the light guide plate 11 from the first surface 111 of the light guide plate 11, such that the optical signal travels toward the emission end 113.

For example, the hologram layer 13 is implemented by a hologram light guide film that selectively guides an optical signal (linearly polarized light) having a predetermined wavelength. For example, the wavelength of the optical signal (linearly polarized light) guided by the hologram light guide film is in a 1.5 μm band, and the optical signal is infrared light.

For example, the hologram layer 13 is configured to be a reflection type diffraction grating having a structure in which a plurality of gratings each having a height on the order of μm. For example, the hologram layer 13 can be implemented by a blazed diffraction grating or a holographic diffraction grating. The hologram layer 13 is configured with a grating interval at which the light incident from the first surface 111 travels toward the emission end 113.

The relay light guide plate 15 is a transparent member having a third surface 151 and a fourth surface 152 facing each other. A relay emission end 153 is formed on one end surface of the relay light guide plate 15. The third surface 151 is a light-receiving surface that receives the optical signal emitted from the emission end 113 of the light guide plate 11. The relay emission end 153 is an end portion from which the optical signal having propagated inside the relay light guide plate 15 is emitted. The relay light guide plate 15 is disposed such that the third surface 151 faces the emission end 113 of the light guide plate 11. The directional light guide layer 16 is disposed on the fourth surface 152 of the relay light guide plate 15. The light receiver 17 is disposed at the relay emission end 153 of the relay light guide plate 15.

The optical signal having traveled from the third surface 151 to the inside of the relay light guide plate 15 is guided by the directional light guide layer 16, totally reflected between the third surface 151 and the fourth surface 152, and propagates toward the relay emission end 153. The optical signal having propagated inside the light guide plate 11 and reached the relay emission end 153 is emitted from the relay emission end 153 toward the light receiver 17.

The directional light guide layer 16 is disposed on the fourth surface 152 of the relay light guide plate 15. The directional light guide layer 16 changes the traveling direction of the optical signal such that the light incident on the inside of the relay light guide plate 15 from the third surface 151 is guided toward the relay emission end 153.

For example, the directional light guide layer 16 is configured to be a plurality of micromirrors that reflects the traveling direction of the optical signal traveling inside the relay light guide plate 15 toward the light receiver 17. The directional light guide layer 16 may be configured to be a plurality of protruding structures having a reflecting surface that reflects the traveling direction of the optical signal from the fourth surface 152 of the relay light guide plate 15 toward the light receiver 17. Furthermore, the directional light guide layer 16 may include a hologram layer similar to the hologram layer 13.

The light receiver 17 is disposed with a light-receiving surface 171 facing the relay emission end 153 of the relay light guide plate 15. The light receiver 17 receives the optical signal emitted from the relay emission end 153 of the relay light guide plate 15. The light receiver 17 converts the received optical signal into an electrical signal. The light receiver 17 outputs the converted electrical signal to a decoder (not illustrated).

For example, the light receiver 17 can be implemented by an element such as a photodiode or a phototransistor. If the light receiver 17 is implemented by an avalanche photodiode, high-speed communication can be supported. Note that the light receiver 17 may be implemented by an element other than the photodiode, the phototransistor, or the avalanche photodiode as long as the element can convert an optical signal into an electrical signal.

The light receiver 17 receives the optical signal in the infrared region. The light receiver 17 receives the optical signal having the wavelength in the 1.5 μm (micrometer) band, for example. Note that the wavelength band of the optical signal received by the light receiver 17 is not limited to the 1.5 μm band, and can be freely set according to the wavelength of the optical signal transmitted from the light-transmitting device (not illustrated). The wavelength band of the optical signal received by the light receiver 17 may be set to, for example, a 0.8 μm band, a 1.55 μm band, or a 2.2 μm band. Furthermore, the wavelength band of the optical signal received by the light receiver 17 may be, for example, a 0.8 to 1 μm band. When the wavelength band of the optical signal is shorter, absorption by moisture in the atmosphere is smaller, which is advantageous for optical space communication during rainfall.

A color filter that selectively transmits light in the wavelength band of the optical signal may be disposed on the light-receiving surface 171 of the light receiver 17. Since the light receiver 17 receives the optical signal in the infrared region, the color filter that selectively transmits the light in the wavelength band of the received optical signal is arranged. If the light receiver 17 is configured such that the color filter is arranged on the light-receiving surface 171 of the light receiver 17 and the optical signal having passed through the color filter is incident on the light receiver 17, a signal-noise ratio (S/N ratio) is improved.

The configuration of the light-receiving device 10 of the present example embodiment has been described above. Note that the configuration illustrated in FIGS. 1 to 3 is an example, and the configuration of the light-receiving device 10 of the present example embodiment is not limited to this form as it is.

APPLICATION EXAMPLE

Figure 4:
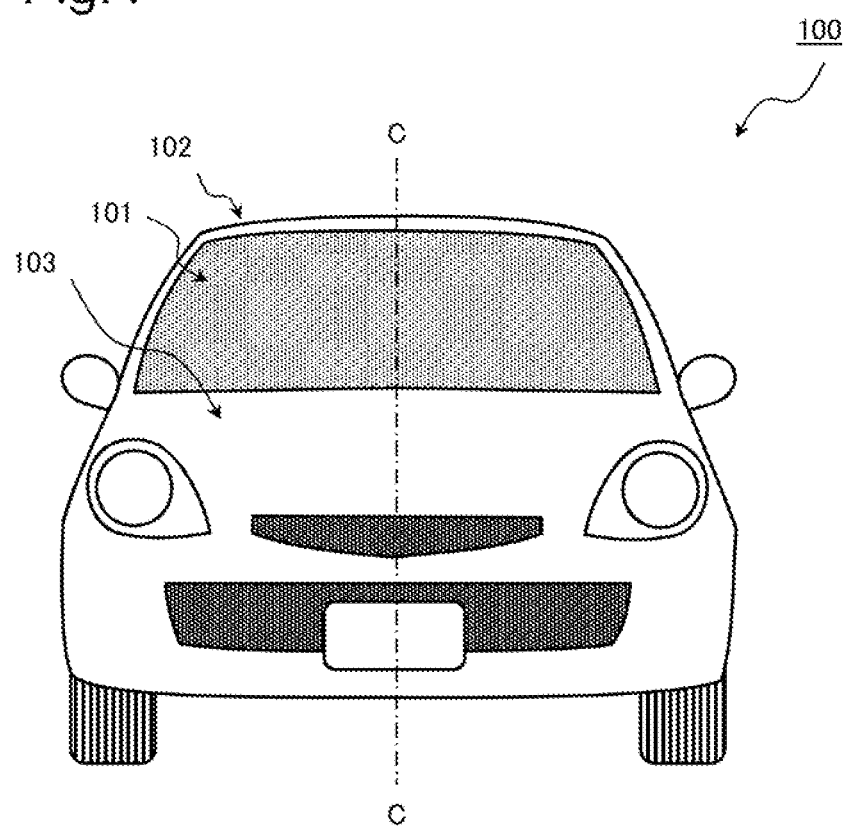
FIG. 4 is a conceptual diagram illustrating an example of an automobile on which the light-receiving device according to the first example embodiment of the present invention is mounted.

Next, Application Example 1 of the light-receiving device 10 of the present example embodiment will be described with reference to the drawings. FIG. 4 is a conceptual diagram illustrating an example of a vehicle 100 on which the light-receiving device 10 is mounted.

Application Example 1

Figure 5:
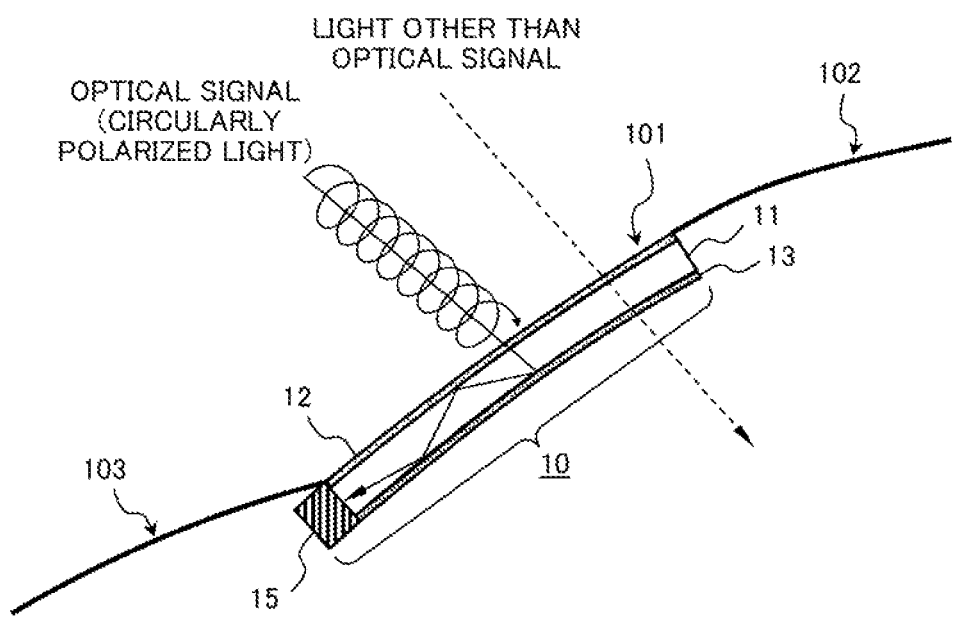
FIG. 5 is a conceptual diagram related to Application Example 1 in which the light-receiving device according to the first example embodiment of the present invention is installed on a front window of the automobile.

Application Example 1 is an example in which the light-receiving device 10 is installed on a front window 101 of the vehicle 100. FIG. 5 is a cross-sectional view of the light-receiving device 10 installed on the front window 101 taken along a line C-C in FIG. 4. Note that the light-receiving device 10 may be installed on a rear window or a side window of the vehicle 100. The light-receiving device 10 may also be installed on a mirror surface such as a rearview mirror or a side mirror of the vehicle.

The light-receiving device 10 is installed at a position of the front window 101 with the wave plate 12 facing the outside of the vehicle and the hologram layer 13 facing the inside of the vehicle. For example, the light-receiving device 10 is installed on an outer side or an inner side of a window plate of the front window 101. The light-receiving device 10 may be installed instead of the front window 101.

Light in a wavelength band other than the wavelength band of the optical signal, which is included in the light passing through the wave plate 12 and entering the light guide plate 11, passes through the hologram layer 13 and enters the vehicle 100. Therefore, even if the light-receiving device 10 is disposed on the front window 101, the field of view of an occupant in the vehicle 100 is not blocked.

In a case where the light-receiving device 10 is disposed on the front window 101, it is desirable that a surface of the light-receiving device 10 is coated with a photocatalyst or the like so that dirt is less likely to adhere to the surface. The surface of the light-receiving device 10 may be subjected to a hydrophilic treatment or a water-repellent treatment in order to prevent adhesion of water droplets. For example, the light-receiving device 10 is desirably configured such that the water droplets adhering to the surface of the light-receiving device 10 are wiped off with a wiper. Furthermore, for example, a heater may be installed on the front window 101 in order to prevent dew condensation on the surface of the light-receiving device 10.

Figure 6:
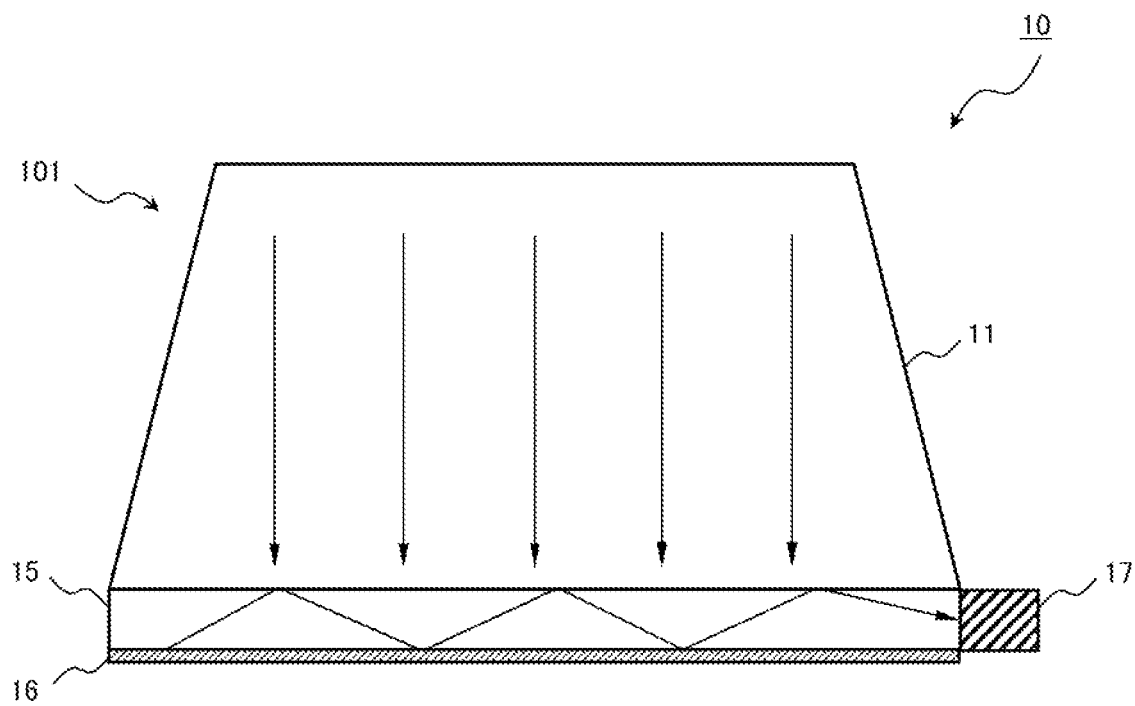
FIG. 6 is a conceptual diagram for describing light guiding of an optical signal in Application Example 1 according to the first example embodiment of the present invention.

FIG. 6 is a conceptual diagram for describing a state of propagation of the optical signal in the example in which the light-receiving device 10 is installed on the front window 101 of the automobile. The optical signal from the outside is converted from the circularly polarized light into the linearly polarized light by the wave plate 12 and enters the light guide plate 11. As illustrated in FIG. 6, the traveling direction of the optical signal having entered the light guide plate 11 is changed toward the relay light guide plate 15 by the hologram layer 13, and the optical signal propagates inside the light guide plate 11. A traveling direction of a part of the optical signal having entered the relay light guide plate 15 from the light guide plate 11 is changed toward the light receiver 17 by the directional light guide layer 16 and received by the light receiver 17.

Figure 7:
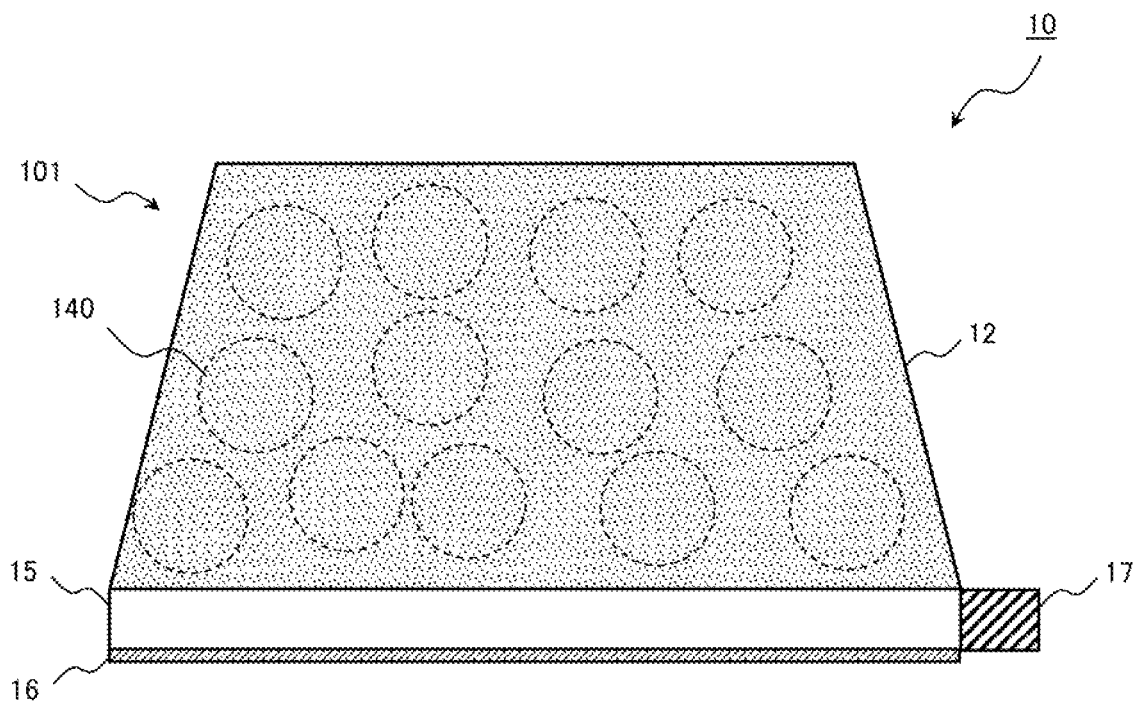
FIG. 7 is a conceptual diagram for describing light reception of the optical signal in Application Example 1 according to the first example embodiment of the present invention.

FIG. 7 is a conceptual diagram for describing the light guiding of the optical signal in the example in which the light-receiving device 10 is installed on the front window 101 of the vehicle 100. In the case where the light-receiving device 10 is installed on the front window 101, the entire surface of the wave plate 12 may be a light-receiving region. Therefore, as illustrated in FIG. 7, the optical signal incident on the wave plate 12 is received by the light receiver 17 even if the optical signal is received by any of light-receiving regions 140, each of which is surrounded by a broken line circle. Therefore, even if some of the light-receiving regions 140, each of which is surrounded by a broken line circle, are shielded, the optical signal received by another of the light-receiving regions 140 is guided to the light receiver 17.

Figure 8:
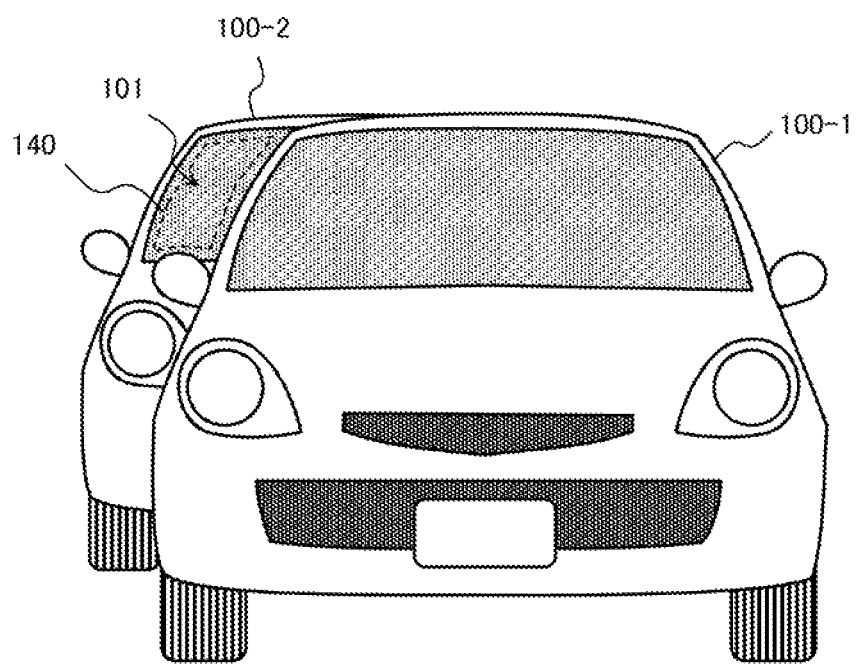
FIG. 8 is a conceptual diagram for describing a light-receiving range for the optical signal in Application Example 1 according to the first example embodiment of the present invention.

FIG. 8 illustrates an example in which most of a front window 101 of a vehicle 100-2 traveling behind is hidden by a vehicle 100-1 traveling ahead. In the example of FIG. 8, the light-receiving device 10 is installed at least on the front window 101 of the vehicle 100-2. Even in the case as illustrated in FIG. 8, if a part of the front window 101 of the vehicle 100-2 is seen from the light-transmitting device (not illustrated), the optical signal can be received by any of the light-receiving regions 140 of the light-receiving device 10 installed on the front window 101 of the vehicle 100-2.

Figure 9:
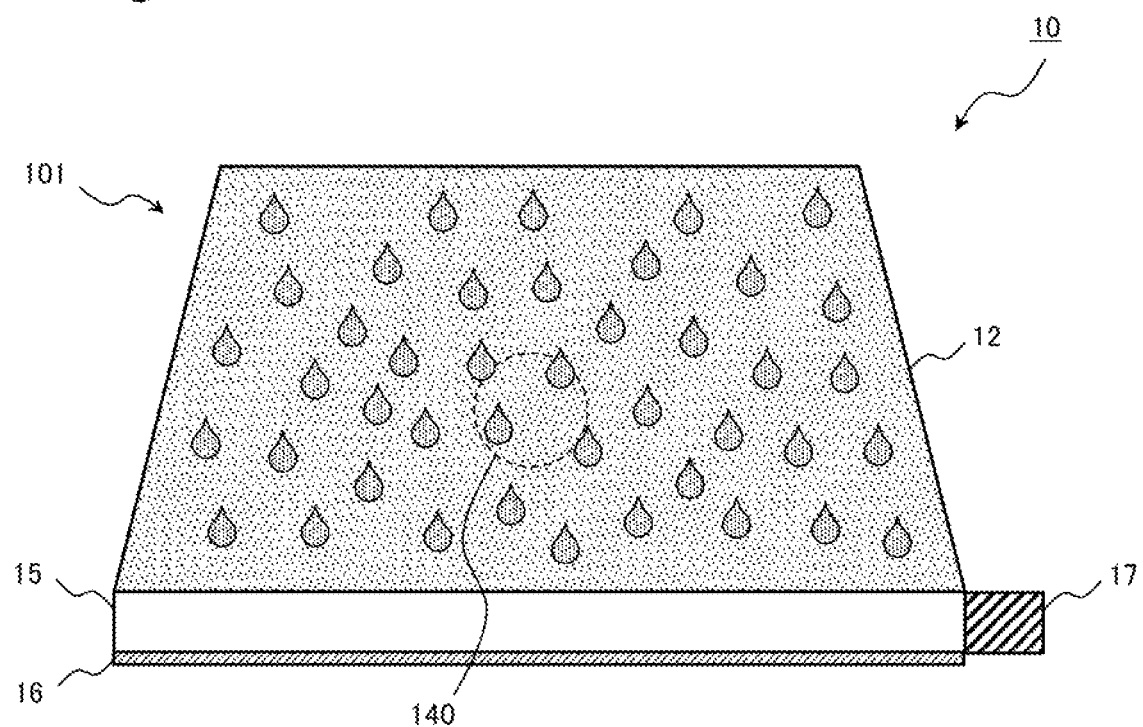
FIG. 9 is a conceptual diagram for describing the light reception of the optical signal in a case where water droplets adhere to a surface of the light-receiving device installed on the front window of the automobile in Application Example 1 according to the first example embodiment of the present invention.

FIG. 9 is a conceptual diagram for describing light reception of the optical signal in a case where water droplets adhere to the surface of the light-receiving device 10 installed on the front window 101 of the vehicle 100 in which the light-receiving device 10 is installed. As illustrated in FIG. 9, even in the case where the water droplets adhere to the surface of the light-receiving device 10, a light-receiving region 140 surrounded by a broken line circle includes a portion where the water droplets do not adhere. Therefore, even in the case where the water droplets adhere to the surface of the light-receiving device 10, the light-receiving device 10 can receive the optical signal at the portion where the water droplets do not adhere. In a case where the entire surface of the light-receiving device 10 is wet, a water film on the surface of the light-receiving device 10 is wiped with the wiper (not illustrated), so that the light-receiving device 10 can continue to receive the optical signal.

If the light-receiving device 10 is installed on the front window 101 of the vehicle 100 as in Application Example 1, the optical signal transmitted from the front can be received by a wide light-receiving surface. In the case where the light-receiving device 10 is installed on the front window 101 of the vehicle 100, it is easy to receive the optical signal transmitted substantially horizontally from the front of the vehicle 100. Note that the light-receiving device 10 may be installed on the rear window, the side window, a mirror, or the like of the vehicle 100. Furthermore, the light-receiving device 10 can be installed not only in the vehicle 100 but also on any window installed in a conveyance, a building, or the like.

Application Example 2

Figure 10:
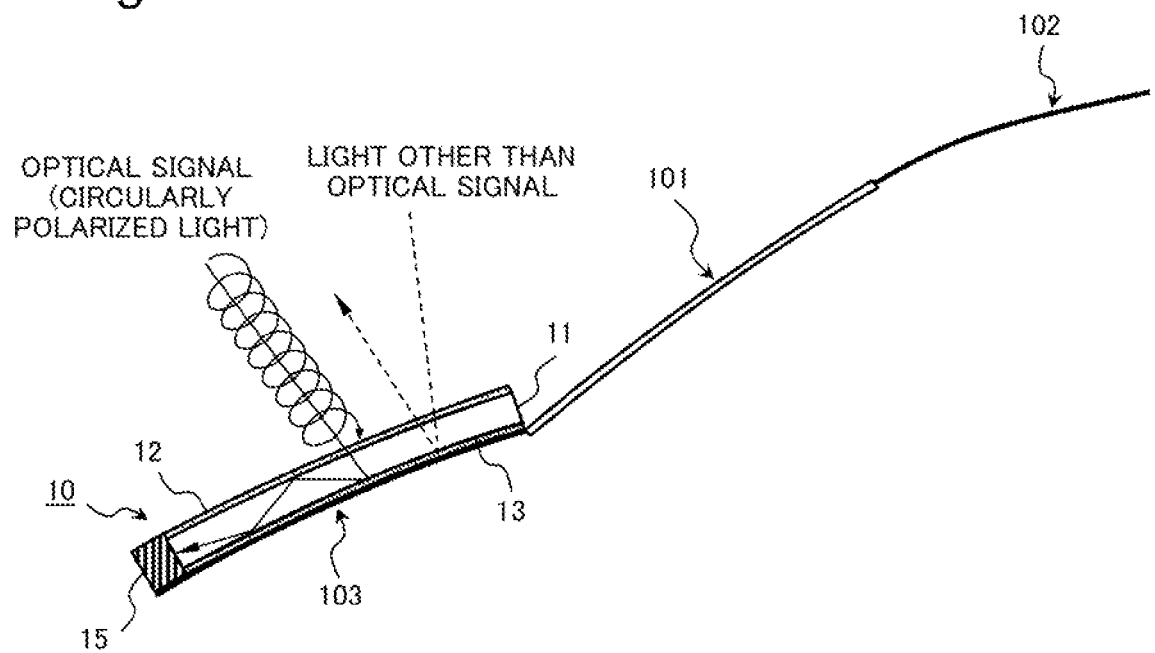
FIG. 10 is a conceptual diagram related to Application Example 2 in which the light-receiving device according to the first example embodiment of the present invention is installed on a hood of the automobile.

Application Example 2 is an example in which the light-receiving device 10 is installed on a hood 103 of the vehicle 100. FIG. 10 is a cross-sectional view of the light-receiving device 10 installed on the hood 103 taken along the line C-C in FIG. 4. Note that the light-receiving device 10 may be installed on a door, a body, or the like of the vehicle 100. The light-receiving device 10 is installed on the hood 103 with the wave plate 12 facing the outside of the vehicle 100 and the hologram layer 13 facing the inside of the vehicle 100.

Application Example 3

Figure 11:
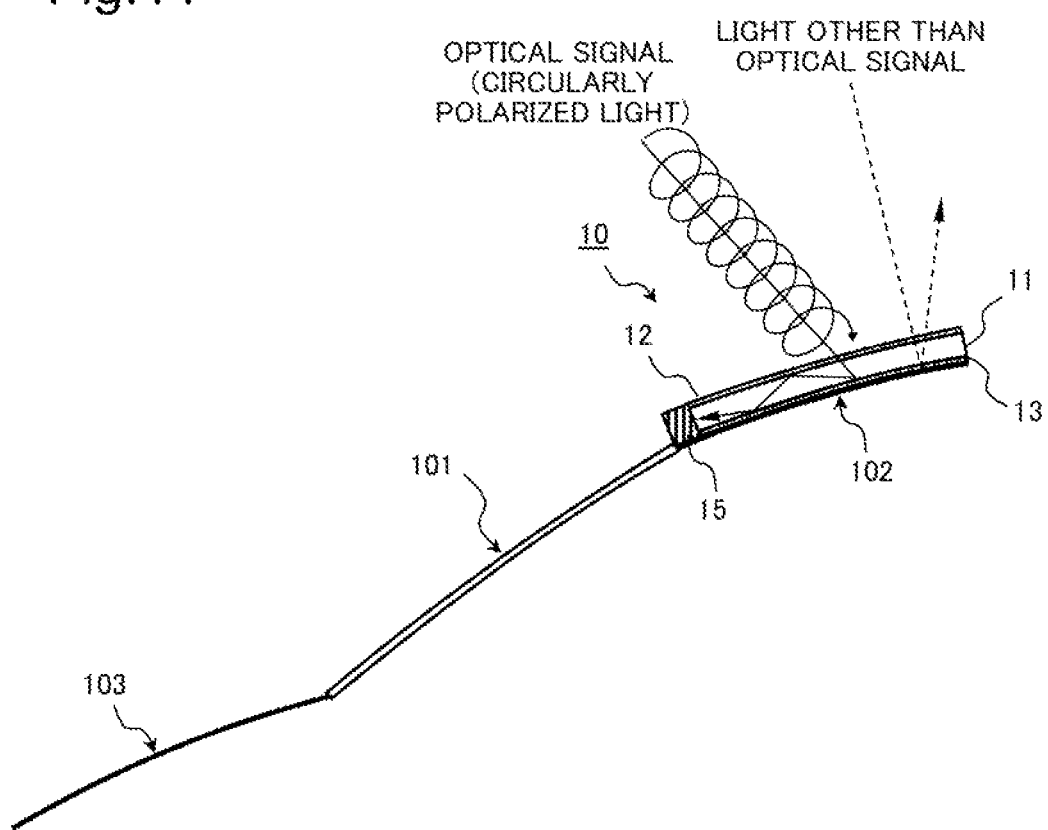
FIG. 11 is a conceptual diagram related to Application Example 3 in which the light-receiving device according to the first example embodiment of the present invention is installed on a roof of the automobile.

Application Example 3 is an example in which the light-receiving device 10 is installed on a roof 102 of the vehicle 100. FIG. 11 is a cross-sectional view of the light-receiving device 10 installed on the roof 102 taken along the line C-C in FIG. 4. The light-receiving device 10 is installed on the roof 102 with the wave plate 12 facing the outside of the vehicle 100 and the hologram layer 13 facing the inside of the vehicle 100.

In the case where the light-receiving device 10 is installed on the hood 103 or the roof 102 as in Application Example 2 or Application Example 3, it is not necessary to consider the transmission of light other than the optical signal. Therefore, in the case where the light-receiving device 10 is installed on the hood 103 or the roof 102, the degree of freedom in selecting the light transmittance of the hologram layer 13 and the thickness of the light-receiving device 10 is larger than that in the case where the light-receiving device 10 is installed on the front window 101.

In addition, in the case where the light-receiving device 10 is installed on the hood 103 or the roof 102, the optical signal transmitted from above is easily received as compared with the case where the light-receiving device 10 is installed on the front window 101. In a case where the light-transmitting device for the optical signal is installed in a traffic light or a street light, installing the light-receiving device 10 on the hood 103 or the roof 102, as in Application Example 2 or Application Example 3, increases the light-receiving surface for the optical signal, and improves a light reception efficiency.

In addition, if light-receiving devices 10 are installed on at least two of the front window 101, the hood 103, and the roof 102, a light-receiving area for the optical signal can be further increased, and thus, the optical signal can be continuously received even if an optical axis of the transmitted optical signal is slightly shifted. If the light-receiving devices 10 are installed at a plurality of places of the vehicle 100 and the receiving surfaces for the optical signal are dispersed on a surface of the vehicle 100, the communication can be continued even if a part of the light-receiving surfaces is shielded.

The light-receiving device 10 of the present example embodiment may be installed not only on the front window 101, the hood 103, or the roof 102 but also on the front, rear, side, or the like of the vehicle 100. If the light-receiving device 10 is installed on the door, a front or rear bumper, or the like of the vehicle 100, it is easy to receive the optical signal transmitted substantially horizontally with respect to a road surface.

As described above, the light-receiving device of the present example embodiment includes the light guide plate, the wave plate, the hologram layer, and the light receiver. The light-receiving device of the present example embodiment further includes the relay light guide plate and the directional light guide layer that relay the optical signal emitted from the emission end of the light guide plate to the light receiver. The light guide plate is the transparent member having, as the main surfaces, the first surface and the second surface facing each other, and has the emission end formed on at least one end portion of the light guide plate. The wave plate is disposed on the first surface of the light guide plate and converts the optical signal of the circularly polarized light into the linearly polarized light. The hologram layer is disposed on the second surface of the light guide plate and guides the traveling direction of the optical signal converted into the linearly polarized light toward the emission end of the light guide plate. The relay light guide plate is the transparent member having the third surface and the fourth surface facing each other, has the relay emission end formed on at least one end portion of the relay light guide plate, and is arranged with the third surface facing the emission end of the light guide plate. The directional light guide layer is disposed on the fourth surface and changes the traveling direction of the optical signal traveling inside the relay light guide plate toward the relay emission end. The light receiver receives the optical signal emitted from the relay emission end of the relay light guide plate, and converts the received optical signal into the electrical signal.

In one aspect of the present example embodiment, the hologram layer guides the optical signal of the linearly polarized light whose polarization direction is the predetermined direction toward the light receiver. In one aspect of the present example embodiment, the traveling direction of the optical signal traveling inside the light guide plate and the traveling direction of the optical signal traveling inside the relay light guide plate are directions crossing each other. In one aspect of the present example embodiment, the wave plate is the quarter wave plate that converts the optical signal having the wavelength in the infrared region from the circularly polarized light into the linearly polarized light.

As an example, the light-receiving device of the present example embodiment is installed on at least a part of a surface of a vehicle body of the vehicle. As an example, the light-receiving device of the present example embodiment is installed on a window of the vehicle. As an example, the light-receiving device of the present example embodiment is installed on a window of a conveyance other than the vehicle or a building.

The light-receiving device of the present example embodiment can be installed in an automobile, for example. If the light-receiving device of the present example embodiment is installed, vehicle-to-vehicle communication by spatial optical communication can be performed between vehicles. Furthermore, if the light-receiving device of the present example embodiment is configured to receive the optical signal transmitted from the light-transmitting device (not illustrated) installed on a road, road-to-vehicle communication by spatial optical communication can be performed between the road and the vehicle.

The light-receiving device of the present example embodiment can be applied not only to the automobile but also to spatial optical communication between moving bodies such as an airplane, a ship, a train, a motorcycle, a bicycle, and a drone. The light-receiving device of the present example embodiment can also be applied to spatial optical communication between objects in a state where at least one of the objects is placed still. Note that application examples of the light-receiving device of the present example embodiment are not limited to the examples described above, and the light-receiving device can be applied to spatial optical communication between any objects arranged at positions where the optical signal can be transmitted and received.

According to the light-receiving device of the present example embodiment, the light-receiving surface for the optical signal can be expanded, and thus, the light reception of the optical signal is less likely to be interrupted even if a part of the light-receiving surface is obstructed by an obstacle or an incident axis of the optical signal is slightly shifted. That is, according to the light-receiving device of the present example embodiment, continuous optical space communication can be performed even if a part of the light-receiving surface is shielded.

In addition, in a case where the optical signal is the circularly polarized light and the light guiding by the hologram layer depends on the polarization direction of the linearly polarized light, noise may occur in the received optical signal when sunlight is also received in addition to the optical signal. In the light-receiving device of the present example embodiment, the hologram layer guides the optical signal (linearly polarized light) having passed through the wave plate that converts the optical signal of the circularly polarized light into the linearly polarized light whose polarization direction is the predetermined direction, and thus, the optical signal can be selectively received by the light receiver. Therefore, according to the light-receiving device of the present example embodiment, it is possible to reduce the noise that may occur in the optical space communication due to external light.

Second Example Embodiment

Next, a light-receiving device according to a second example embodiment of the present invention will be described with reference to the drawings. The light-receiving device of the present example embodiment is different from that of the first example embodiment in that a relay light guide plate and a directional light guide layer are not included.

(Configuration)

Figure 12:
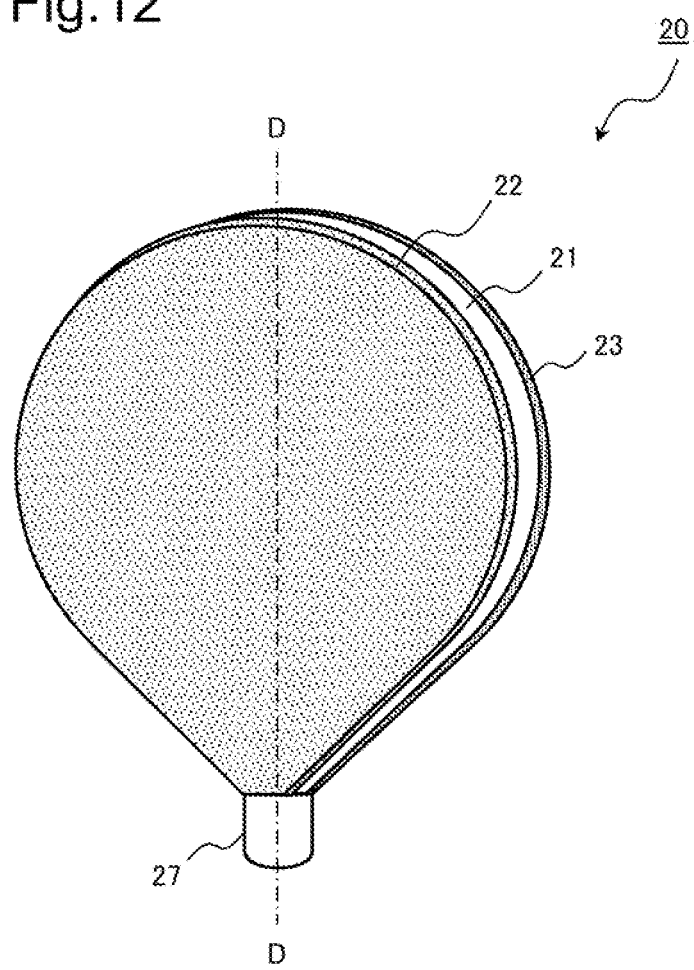
FIG. 12 is a perspective view of an example of a light-receiving device according to a second example embodiment of the present invention.
Figure 13:
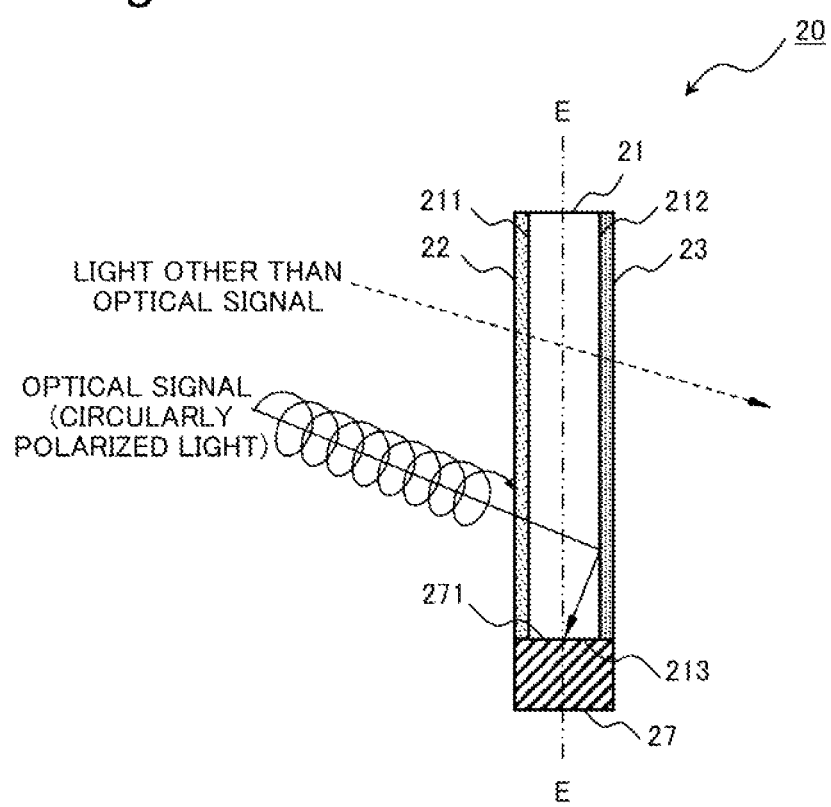
FIG. 13 is a cross-sectional view of the example of the light-receiving device according to the second example embodiment of the present invention.
Figure 14:
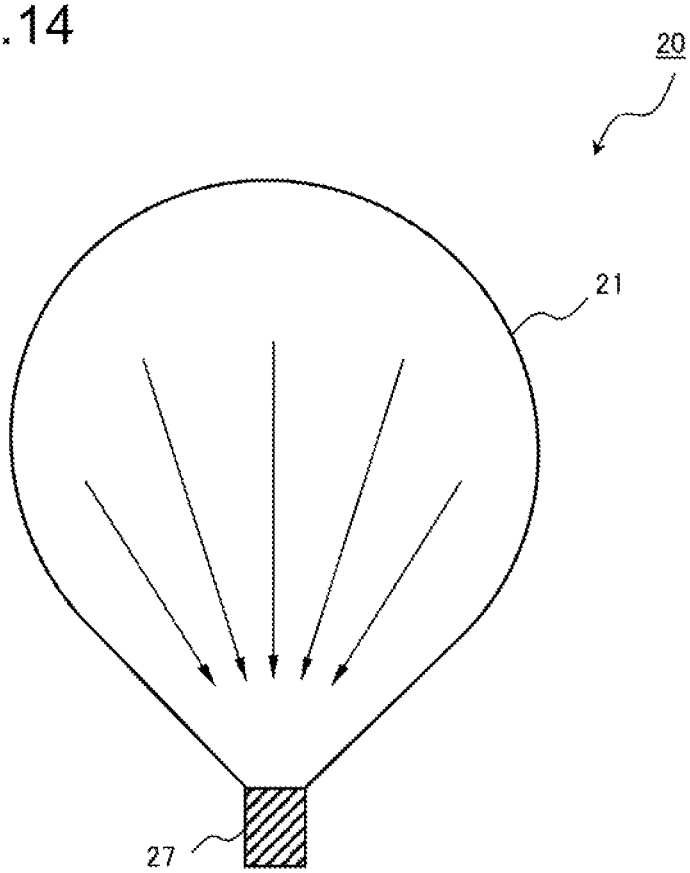
FIG. 14 is another cross-sectional view of the example of the light-receiving device according to the second example embodiment of the present invention.

FIGS. 12 to 14 are conceptual diagrams for describing an example of a configuration of a light-receiving device 20 of the present example embodiment. FIG. 12 is a perspective view of the example of the light-receiving device 20. FIG. 13 is a cross-sectional view of the light-receiving device 20 taken along a line D-D in FIG. 12. FIG. 14 is a cross-sectional view of the light-receiving device 20 taken along a line E-E in FIG. 12. FIGS. 13 and 14 illustrate arrows conceptually illustrating a state of traveling of an optical signal inside the light-receiving device 20.

The light-receiving device 20 includes a light guide plate 21, a wave plate 22, a hologram layer 23, and a light receiver 27. The light guide plate 21, the wave plate 22, the hologram layer 23, and the light receiver 27 have configurations associated to the light guide plate 11, the wave plate 12, the hologram layer 13, and the light receiver 17 of the light-receiving device 10 of the first example embodiment, respectively.

The light guide plate 21 is a plate-shaped transparent member having, as main surfaces, a first surface 211 and a second surface 212 facing each other. The transparent member is a member that transmits light in a wavelength region including a wavelength of the optical signal. The light guide plate 21 is preferably a member that transmits light in a wavelength region including a visible region and an infrared region. The first surface 211 is a light-receiving surface that receives the optical signal propagating through space. The light guide plate 21 has a teardrop-shaped outer shape, and an emission end 213 is formed on one end surface of a vertex portion of the light guide plate 21. The emission end 213 is an end portion from which the optical signal propagating inside the light guide plate 21 is emitted toward the outside. Note that the light guide plate 21 may have an outer shape other than the teardrop shape as long as the light guide plate 21 can form the emission end 213 from which the optical signal is emitted toward the single light receiver 27. For example, the light guide plate 21 may have any shape such as a circle, an ellipse, a polygon, an egg shape, or a gourd shape. The emission end 213 does not have to be positioned at a vertex or a corner as long as the emission end 213 is at an end portion of the light guide plate 21.

The wave plate 22 is disposed on the first surface 211 of the light guide plate 21. The hologram layer 23 is disposed on the second surface 212 of the light guide plate 21. That is, the light guide plate 21 is sandwiched between the wave plate 22 and the hologram layer 23. In addition, the light receiver 27 is disposed at the emission end 213 of the light guide plate 21. The light guide plate 21 is different from the light guide plate 11 of the first example embodiment in the outer shape thereof and in that the emission end 213 from which the optical signal is emitted toward the single light receiver 27 is formed, but a material, a function, and the like are similar to those of the light guide plate 11.

A traveling direction of the optical signal (linearly polarized light) having passed through the wave plate 22 and incident on the inside of the light guide plate 21 from the first surface 211 is changed toward the emission end 213 by the hologram layer 23 disposed on the second surface 212. The optical signal whose traveling direction has been changed by the hologram layer 23 propagates inside the light guide plate 21 toward the emission end 213. In FIG. 14, a state in which the received optical signal propagates inside the light guide plate 21 toward the light receiver 27 is indicated by arrows.

The wave plate 22 is disposed on the first surface of the light guide plate 21. The wave plate 22 is a quarter wave plate that gives a phase difference of $\lambda/4$ ($\pi/2$) to a polarization plane of the optical signal propagating through space and converts the optical signal from circularly polarized light into linearly polarized light ($\lambda$: the wavelength of the optical signal). The optical signal converted into the linearly polarized light by the wave plate 22 enters the first surface 211 of the light guide plate 21. The wave plate 22 has a configuration similar to that of the wave plate 12 of the first example embodiment.

The hologram layer 23 is disposed on the second surface 212 of the light guide plate 21. The hologram layer 23 changes the traveling direction of the optical signal (linearly polarized light). The hologram layer 23 is designed according to a polarization direction in a predetermined direction. The hologram layer 23 guides the optical signal such that the light incident on the light guide plate 21 from the first surface 211 of the light guide plate 21 travels toward the emission end 213. The hologram layer 23 has a configuration similar to that of the hologram layer 13 of the first example embodiment.

The light receiver 27 is disposed with a light-receiving surface 271 facing the emission end 213 of the light guide plate 21. The light receiver 27 receives the optical signal emitted from the emission end 213 of the light guide plate 21. The light receiver 27 is an element similar to the light receiver 17 of the first example embodiment.

The configuration of the light-receiving device 20 of the present example embodiment has been described above. Note that the configuration illustrated in FIGS. 12 to 14 is an example, and the configuration of the light-receiving device 20 of the present example embodiment is not limited to this form as it is.

APPLICATION EXAMPLE

Figure 15:
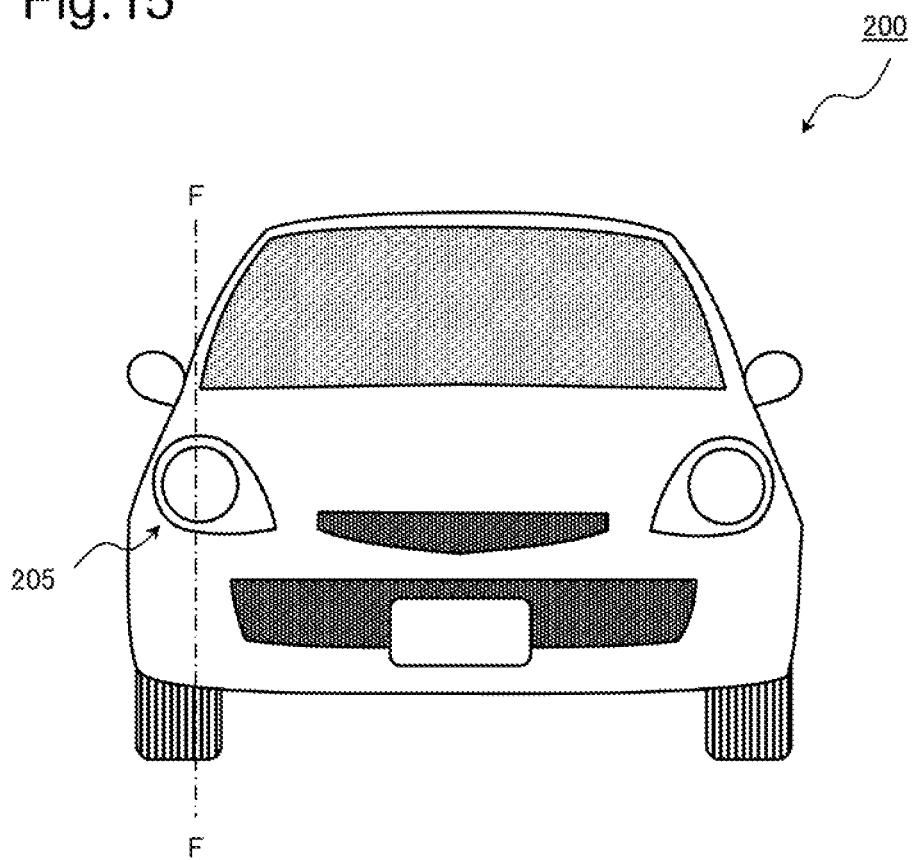
FIG. 15 is a conceptual diagram illustrating an example of an automobile on which the light-receiving device according to the second example embodiment of the present invention is mounted.

Next, application examples of the light-receiving device 20 of the present example embodiment will be described with reference to the drawings. FIG. 15 is a conceptual diagram illustrating an example of a vehicle 200 on which the light-receiving device 20 is mounted.

Application Example 4

Figure 16:
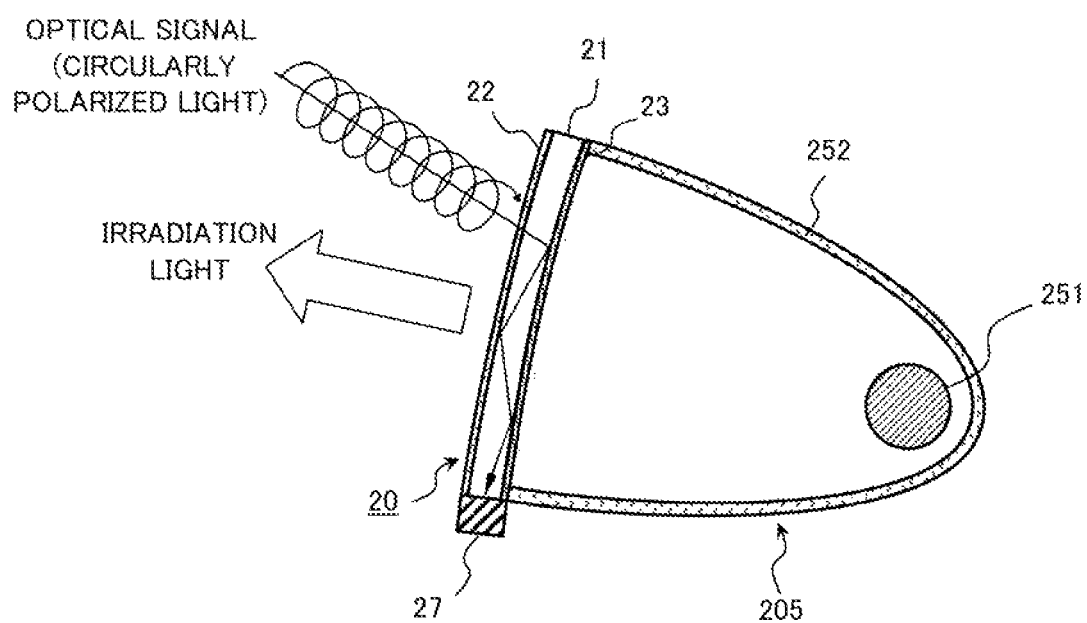
FIG. 16 is a conceptual diagram related to Application Example 4 in which the light-receiving device according to the second example embodiment of the present invention is installed on a headlight of the automobile.

Application Example 4 is an example in which the light-receiving device 20 is installed on a headlight 205 of the vehicle 200. FIG. 16 is a cross-sectional view of the light-receiving device 20 installed on the headlight 205 taken along a line F-F in FIG. 15.

The headlight 205 includes a valve 251 that emits irradiation light. A reflection mirror surface 252 that reflects the irradiation light emitted from the valve 251 is formed on an inner surface of the headlight 205.

The light-receiving device 20 is installed at a position of an irradiation window of the headlight 205 with the wave plate 22 facing the outside of the headlight 205 and the hologram layer 23 facing the inside of the headlight 205. The light-receiving device 20 may be disposed on an outer side of the irradiation window, on an inner side of the irradiation window, or instead of the irradiation window.

The optical signal from the outside is converted from the circularly polarized light into the linearly polarized light by the wave plate 22 and enters the light guide plate 21. The traveling direction of the optical signal having entered the light guide plate 21 is changed toward the light receiver 27 by the hologram layer 23, and the optical signal is received by the light receiver 27. The irradiation light emitted from the valve 251 is reflected by the reflection mirror surface 252, passes through the light-receiving device 20, and is emitted toward the outside.

If the light-receiving device 20 is installed on the headlight 205 as in Application Example 4, it is easy to receive signal light transmitted substantially horizontally with respect to a road surface from the front of the vehicle. Note that the light-receiving device 20 may be installed not only on the headlight 205 but also on a brake lamp, a direction indicator, or the like. The light-receiving device 20 can be installed not only in the vehicle 200 but also on any light.

As described above, the light-receiving device of the present example embodiment includes the light guide plate, the wave plate, the hologram layer, and the light receiver. The light guide plate is the transparent member having, as the main surfaces, the first surface and the second surface facing each other, and has the emission end formed on at least one end portion of the light guide plate. The wave plate is disposed on the first surface of the light guide plate and converts the optical signal of the circularly polarized light into the linearly polarized light. The hologram layer is disposed on the second surface of the light guide plate and guides the traveling direction of the optical signal converted into the linearly polarized light toward the emission end of the light guide plate. The light receiver receives the optical signal emitted from the emission end of the light guide plate, and converts the received optical signal into the electrical signal.

The shape of each of the main surfaces of the light guide plate of one aspect of the present example embodiment is the teardrop shape in which the emission end is formed at the vertex portion. As an example, the light-receiving surface of the light receiver is connected to the emission end formed at the vertex portion of the teardrop-shaped light guide plate.

As an example, the light-receiving device of the present example embodiment is installed on at least a part of a surface of a vehicle body of the vehicle. As an example, the light-receiving device of the present example embodiment is installed on a light of the vehicle. As an example, the light-receiving device of the present example embodiment is installed on a light of a conveyance other than the vehicle or a building.

Third Example Embodiment

Next, a reception system according to a third example embodiment of the present invention will be described with reference to FIG. 17. The reception system of the present example embodiment includes the light-receiving device of the first or second example embodiment. The reception system of the present example embodiment decodes an optical signal received by the light-receiving device, and outputs decoded information.

Figure 17:
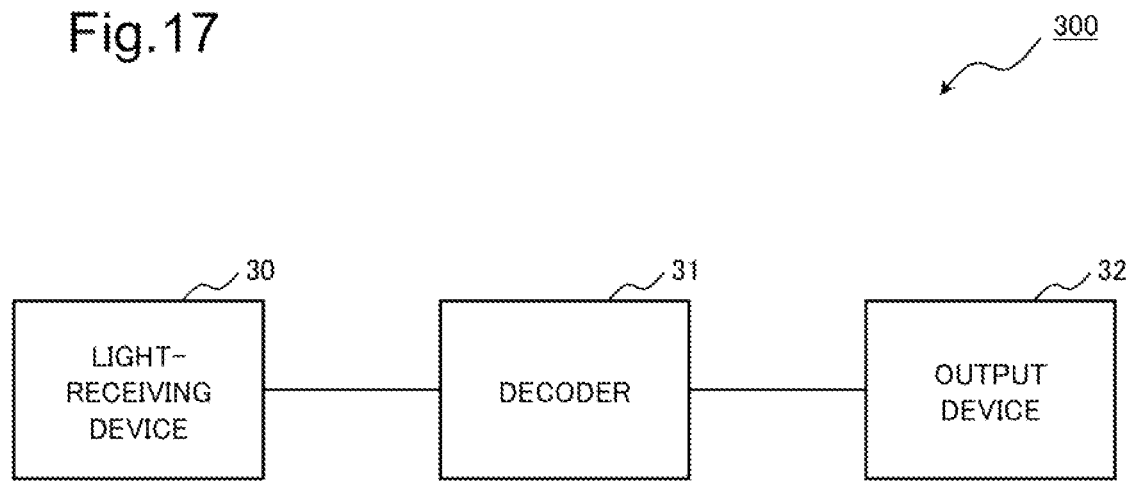
FIG. 17 is a block diagram illustrating an example of a reception system according to a third example embodiment of the present invention.

FIG. 17 is a block diagram illustrating an example of a configuration of a reception system 300 of the present example embodiment. As illustrated in FIG. 17, the reception system 300 includes a light-receiving device 30, a decoder 31, and an output device 32.

The light-receiving device 30 is connected to the decoder 31. The light-receiving device 30 is at least one of the light-receiving device 20 of the first example embodiment or the light-receiving device 10 of the second example embodiment. The light-receiving device 30 converts the received signal into an electrical signal, and transmits the converted electrical signal to the decoder 31.

The decoder 31 is connected to the light-receiving device 30 and the output device 32. The decoder 31 receives the electrical signal from the light-receiving device 30. The decoder 31 decodes data from the received electrical signal. The decoder 31 transmits the decoded data to the output device 32.

The output device 32 is connected to the decoder 31. The output device 32 receives the data from the decoder 31. The output device 32 outputs the received data. For example, the output device 32 converts the received data into an image or audio and outputs the image or audio. The output device 32 is implemented by, for example, a display device or an audio device.

The reception system 300 of the present example embodiment has been described above. Note that the configuration in FIG. 17 is an example, and the configuration of the reception system 300 of the present example embodiment is not limited to this form as it is.

As described above, the reception system of the present example embodiment includes the light-receiving device of the first or second example embodiment, the decoder that decodes the data using the electrical signal converted by the light-receiving device, and the output device that outputs the data decoded by the decoder.

Fourth Example Embodiment

Next, a light-receiving device according to a fourth example embodiment will be described with reference to FIG. 18. The light-receiving device of the present example embodiment has a configuration in which the light-receiving devices of the first and second example embodiments are simplified.

Figure 18:
FIG. 18 is a perspective view of an example of a light-receiving device according to a fourth example embodiment of the present invention.

FIG. 18 is a conceptual diagram for describing an example of a configuration of a light-receiving device 40 of the present example embodiment. The light-receiving device 40 includes a light guide plate 41, a wave plate 42, a hologram layer 43, and a light receiver 47.

The light guide plate 41 is a transparent member having, as main surfaces, a first surface and a second surface facing each other. An emission end is formed on at least one end portion of the light guide plate 41.

The wave plate 42 is disposed on the first surface of the light guide plate 41. The wave plate 42 converts an optical signal of circularly polarized light into linearly polarized light.

The hologram layer 43 is disposed on the second surface of the light guide plate 41. The hologram layer 43 guides a traveling direction of the optical signal converted into the linearly polarized light toward the emission end of the light guide plate 41.

The light receiver 47 receives the optical signal emitted from the emission end of the light guide plate 41. The light receiver 47 converts the received optical signal into an electrical signal.

As described above, the light-receiving device of the present example embodiment includes the light guide plate, the wave plate, the hologram layer, and the light receiver. The light guide plate is the transparent member having, as the main surfaces, the first surface and the second surface facing each other. The emission end is formed on at least one end portion of the light guide plate. The wave plate is disposed on the first surface of the light guide plate. The wave plate converts the optical signal of the circularly polarized light into the linearly polarized light. The hologram layer is disposed on the second surface of the light guide plate. The hologram layer guides the traveling direction of the optical signal converted into the linearly polarized light toward the emission end of the light guide plate. The light receiver receives the optical signal emitted from the emission end of the light guide plate. The light receiver converts the received optical signal into the electrical signal.

Since the light-receiving device of the present example embodiment receives light by a two-dimensionally expanded light-receiving surface, continuous optical space communication can be performed even if a part of the light-receiving surface is shielded.

While the present invention has been particularly shown and described with reference to exemplary embodiments thereof, the present invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2019-110496, filed on Jun. 13, 2019, the disclosure of which is incorporated herein in its entirety by reference.

REFERENCE SIGNS LIST 10, 20 light-receiving device
11, 21 light guide plate
12, 22 wave plate
13, 23 hologram layer
15 relay light guide plate
16 directional light guide layer
17, 27 light receiver
30 light-receiving device
31 decoder
32 output device
100, 200 vehicle
101 front window
102 roof
103 hood
205 headlight
251 valve
252 reflection mirror surface
300 reception system

What is claimed is:

1. A light-receiving device comprising:
a light guide plate that is a transparent member having, as main surfaces, a first surface and a second surface facing each other and has an emission end formed on at least one end portion of the light guide plate;
a wave plate that is disposed on the first surface of the light guide plate and converts an optical signal of circularly polarized light into linearly polarized light;
a hologram layer that is disposed on the second surface of the light guide plate and guides a traveling direction of the optical signal converted into the linearly polarized light toward the emission end of the light guide plate; and
a light receiver that receives the optical signal emitted from the emission end of the light guide plate and converts the received optical signal into an electrical signal.

2. The light-receiving device according to claim 1, wherein
the hologram layer
guides the optical signal of the linearly polarized light whose polarization direction is a predetermined direction toward the light receiver.

3. The light-receiving device according to claim 1, wherein a shape of each of the main surfaces of the light guide plate is a teardrop shape in which the emission end is formed at a vertex portion.

4. The light-receiving device according to claim 1, further comprising
a relay light guide plate and a directional light guide layer that relay the optical signal emitted from the emission end of the light guide plate to the light receiver, the relay light guide plate and the directional light guide layer being provided between the emission end of the light guide plate and the light receiver, wherein
the relay light guide plate
is a transparent member having a third surface and a fourth surface facing each other, has a relay emission end formed on at least one end portion of the relay light guide plate, and is disposed with the third surface facing the emission end of the light guide plate, the directional light guide layer
is disposed on the fourth surface, and changes the traveling direction of the optical signal traveling inside the relay light guide plate toward the relay emission end, and the light receiver receives the optical signal emitted from the relay emission end of the relay light guide plate, and converts the received optical signal into the electrical signal.

5. The light-receiving device according to claim 4, wherein the traveling direction of the optical signal traveling inside the light guide plate and the traveling direction of the optical signal traveling inside the relay light guide plate are directions crossing each other.

6. The light-receiving device according to claim 1, wherein the wave plate is a quarter wave plate that converts the optical signal having a wavelength in an infrared region from the circularly polarized light into the linearly polarized light.

7. A window on which the light-receiving device according to claim 1 is installed.

8. A light on which the light-receiving device according to claim 1 is installed.

9. A vehicle in which the light-receiving device according to claim 1 is installed on at least a part of a surface of a vehicle body.

10. A reception system comprising:

the light-receiving device according to claim 1;

a decoder that decodes data from the electrical signal converted by the light-receiving device; and an output device that outputs the data decoded by the decoder.

\* \* \* \* \*